(12) United States Patent
Hsieh et al.

(10) Patent No.: US 10,578,655 B2
(45) Date of Patent: Mar. 3, 2020

(54) USING VOLTAGE RIDE THROUGH FREQUENCY HISTOGRAM FOR LOW CURRENT MEASUREMENT

(71) Applicant: Institute of Nuclear Energy Research, Atomic Energy Council, Executive Yuan, Taoyuan (TW)

(72) Inventors: Chi-Wen Hsieh, Taipei (TW); Yi-Chun Lin, Taoyuan (TW); Tseng-Te Huang, Taoyuan (TW); Ming-Chen Yuan, Taoyuan (TW); Chien-Hau Chu, Taoyuan (TW); Yu-Chin Chi, Taoyuan (TW)

(73) Assignee: INSTITUTE OF NUCLEAR ENERGY RESEARCH ATOMIC ENERGY COUNCIL, EXECUTIVE YUAN, Taoyuan (TW)

( * ) Notice: Subject to any disclaimer, the term of this patent is extended or adjusted under 35 U.S.C. 154(b) by 512 days.

(21) Appl. No.: 15/431,828

(22) Filed: Feb. 14, 2017

(65) Prior Publication Data

US 2017/0336446 A1 Nov. 23, 2017

(30) Foreign Application Priority Data

May 17, 2016 (TW) .............................. 105207157 U

(51) Int. Cl.
*G01R 19/252* (2006.01)

(52) U.S. Cl.
CPC .................................. *G01R 19/252* (2013.01)

(58) Field of Classification Search
CPC ...................................................... G01R 19/252
USPC .......................................................... 702/64
See application file for complete search history.

(56) References Cited

U.S. PATENT DOCUMENTS

| 6,320,935 | B1 * | 11/2001 | Shinar | A61N 5/1001 378/119 |
| 2003/0105397 | A1 * | 6/2003 | Turner | G01T 1/2985 600/436 |
| 2011/0098970 | A1 * | 4/2011 | Hug | G01F 23/284 702/159 |
| 2016/0341762 | A1 * | 11/2016 | Waters | G01C 19/04 |

\* cited by examiner

*Primary Examiner* — Ricky Ngon
(74) *Attorney, Agent, or Firm* — Birch, Stewart, Kolasch & Birch, LLP

(57) ABSTRACT

A device for measuring low currents is proposed to include: a transimpedance amplifier to convert an analog current signal into an analog voltage signal; an analog-to-digital converter to acquire a graph that plots a curve representing variation of the analog voltage signal using digital codes; a statistic module to acquire a set of crossing numbers by: for each of the digital codes, making a straight line that has a constant value equaling the digital code across time in the graph, and counting a number of crossings of the curve with the straight line; and an analysis module to analyze distribution of the crossing numbers, and to output an output code based on the distribution of the crossing numbers.

12 Claims, 4 Drawing Sheets

USING VOLTAGE RIDE THROUGH FREQUENCY HISTOGRAM FOR LOW CURRENT MEASUREMENT

CROSS-REFERENCE TO RELATED APPLICATION

This application claims priority of Taiwanese Patent Application No. 105207157, filed on May 17, 2016.

FIELD

The disclosure relates to measurement of low currents, and more particularly to a device and a method for measuring low currents.

BACKGROUND

Ionizing radiation dose can be estimated by analyzing a magnitude of an ionization current resulting from an ionization chamber sensing ionizing radiation. In some applications that have a strict requirement of measurement uncertainty (e.g., having an error tolerance that is generally less than 3%), such as a dose area product (DAP) meter, a desired dynamic range of the ionization current may range between, for example, 1 pA and 100 nA.

When a transimpedance amplifier and an analog-to-digital converter are simply used to convert the measured weak current into digital codes, the measurement precision is influenced by a plurality of factors, such as high resistance resistors of the transimpedance amplifier, alternating current (AC) voltage coupling, thermal noise, the bit number limit of analog-to-digital conversion, and periodic and/or non-periodic noises that may be coupled to electronic circuits and that may result in large periodic and/or non-periodic oscillation of an analog voltage signal converted from the weak current by the transimpedance amplifier. Although the periodic noise may be filtered out using techniques such as spectrum analysis, filters, etc., oscillation of the analog voltage signal may exceed upper and/or lower limits of the digital codes, causing the final output to be unreliable.

SUMMARY

Therefore, an object of the disclosure is to provide a device and a method for measuring a weak current with high precision.

The device for measuring weak currents includes a transimpedance amplifier, an analog-to-digital converter, a statistic module and an analysis module. The transimpedance amplifier is disposed to receive an analog current signal, and is configured to convert the analog current signal into an analog voltage signal. The analog-to-digital converter is coupled to the transimpedance amplifier for receiving the analog voltage signal therefrom, and is configured to convert the analog voltage signal into a voltage code that uses a plurality of digital codes to represent a magnitude of the analog voltage signal which varies with time, and to acquire a voltage variation graph that plots a voltage variation curve representing variation of the voltage code with respect to time. The statistic module is configured to acquire a set of crossing numbers that respectively correspond to the digital codes by: for each of the digital codes, making a straight line that has a constant value equaling the digital code across time in the voltage variation graph, and counting a number of crossings of the voltage variation curve with the straight line to serve as a corresponding one of the crossing numbers. The analysis module is coupled to the statistic module for receiving the crossing numbers therefrom, and is configured to analyze distribution of the crossing numbers with respect to the digital codes, and to output, based on the distribution of the crossing numbers thus analyzed, one of the digital codes to serve as an output code.

According to the disclosure, the method for measuring weak currents includes steps of: (A) converting, by a transimpedance amplifier, an analog current signal into an analog voltage signal; (B) by an analog-to-digital converter, converting the analog voltage signal into a voltage code that uses a plurality of digital codes to represents a magnitude of the analog voltage signal which varies with time, and acquiring a voltage variation graph that plots a voltage variation curve representing variation of the voltage code with respect to time; (C) acquiring, by a statistic module, a set of crossing numbers that respectively correspond to the digital codes by: for each of the digital codes, making a straight line that has a constant value equaling the digital code across time in the voltage variation graph, and counting a number of crossings of the voltage variation curve with the straight line to serve as a corresponding one of the crossing numbers; and (D) by an analysis module, analyzing distribution of the crossing numbers with respect to the digital codes, and outputting, based on the distribution of the crossing numbers thus analyzed, one of the digital codes to serve as an output code.

BRIEF DESCRIPTION OF THE DRAWINGS

Other features and advantages of the disclosure will become apparent in the following detailed description of the embodiment (s) with reference to the accompanying drawings, of which.

DETAILED DESCRIPTION

Figure 1:
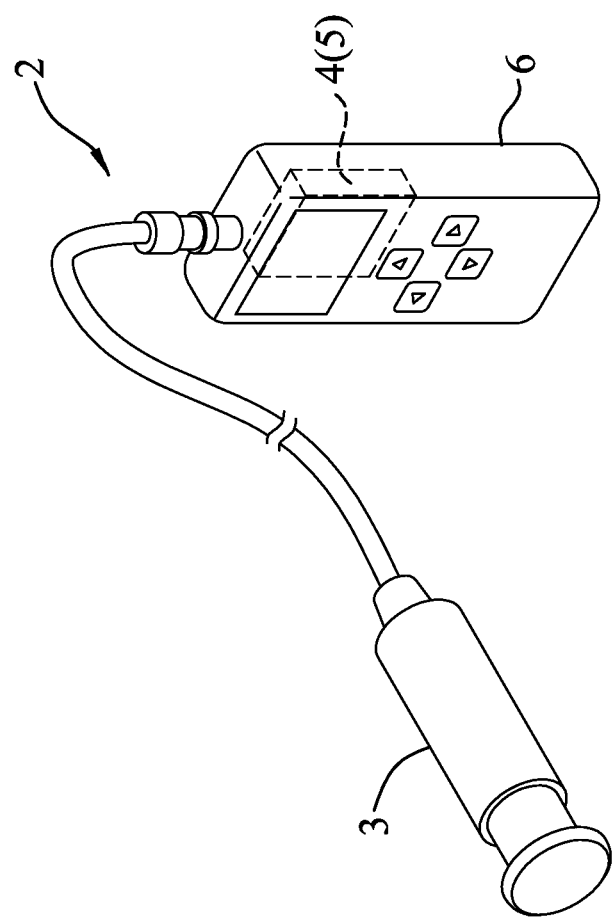
FIG. 1 is a perspective view illustrating an embodiment of a current measuring device according to the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

Figure 2:
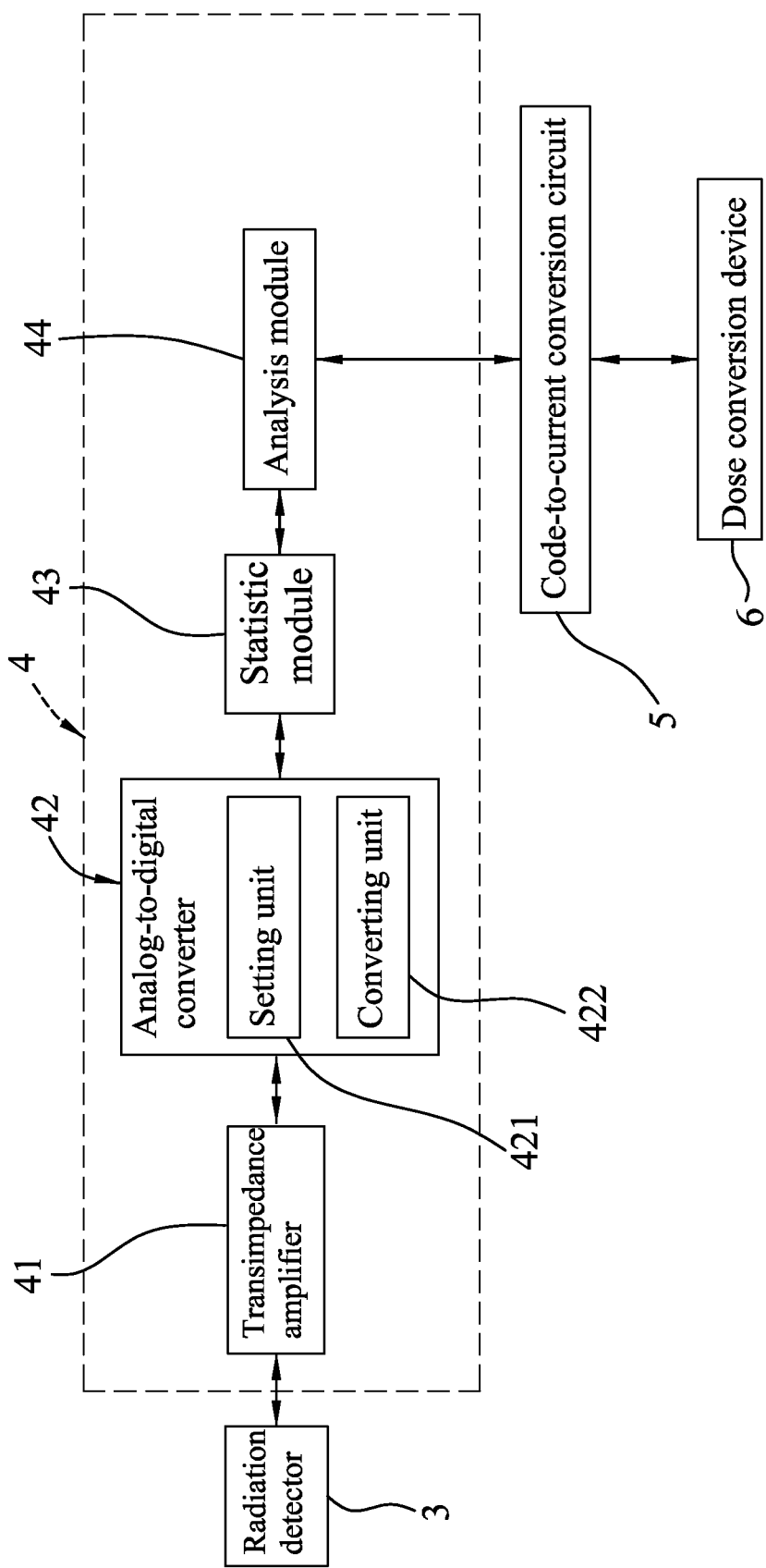
FIG. 2 is a block diagram illustrating functional blocks of the embodiment.

Referring to FIGS. 1 and 2, the embodiment of the current measuring device 4 for measuring low currents according to this disclosure is exemplified to be applied in a DAP meter 2 that is configured for detecting dose of ionizing radiation. The DAP meter 2 includes a radiation detector 3, the current measuring device 4, a code-to-current conversion circuit 5, and a dose conversion device 6.

The radiation detector 3 may be a penetration ionization chamber or other equipment that is capable of sensing ionizing radiation, and that outputs an analog current signal according to the ionizing radiation thus sensed. Since such equipments should be well known to persons having ordinary skill in the art, details thereof are omitted herein for the sake of brevity.

The current measuring device 4 is configured to use voltage ride through frequency histogram for low current measurement, is coupled to the radiation detector 3, and includes a transimpedance amplifier 41, an analog-to-digital converter 42, a statistic module 43, and an analysis module 44.

The transimpedance amplifier 41 is coupled to the radiation detector 3 for receiving the analog current signal therefrom, and converts the analog current signal into an analog voltage signal. In this embodiment, the transimpedance amplifier 41 is formed by coupling a high precision and high resistance component across an inverting input and an output of an operational amplifier, but this disclosure is not limited thereto. In other embodiments, an instrumentation amplifier may be used in the transimpedance amplifier 41.

The analog-to-digital converter 42 is coupled to the transimpedance amplifier 41 for receiving the analog voltage signal therefrom, converts the analog voltage signal into a voltage code that uses a plurality of digital codes to represents a magnitude of the analog voltage signal which varies with time, and acquires a voltage variation graph that plots a voltage variation curve representing variation of the voltage code with respect to time. In this embodiment, the analog-to-digital converter 42 includes a setting unit 421 and a converting unit 422. The setting unit 421 is operable to set a sampling time length (e.g., 0.1 seconds) and a sampling frequency for analog-to-digital conversion, which may be selected from a range of between 1 kHz and 10 kHz in this embodiment. The converting unit 422 samples the analog voltage signal with the sampling frequency during a plurality of sampling periods each having the sampling time length so as to generate the voltage code for each of the sampling periods, and acquires the voltage variation graph for each of the sampling periods.

Figure 4:
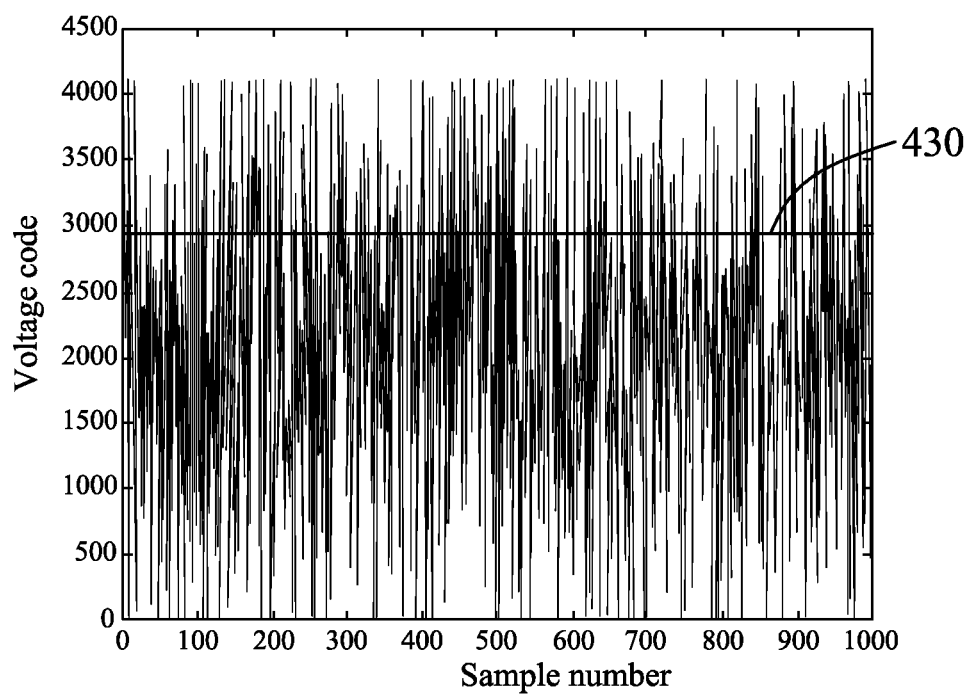
FIG. 4 is a plot illustrating an exemplary voltage variation graph.
Figure 5:
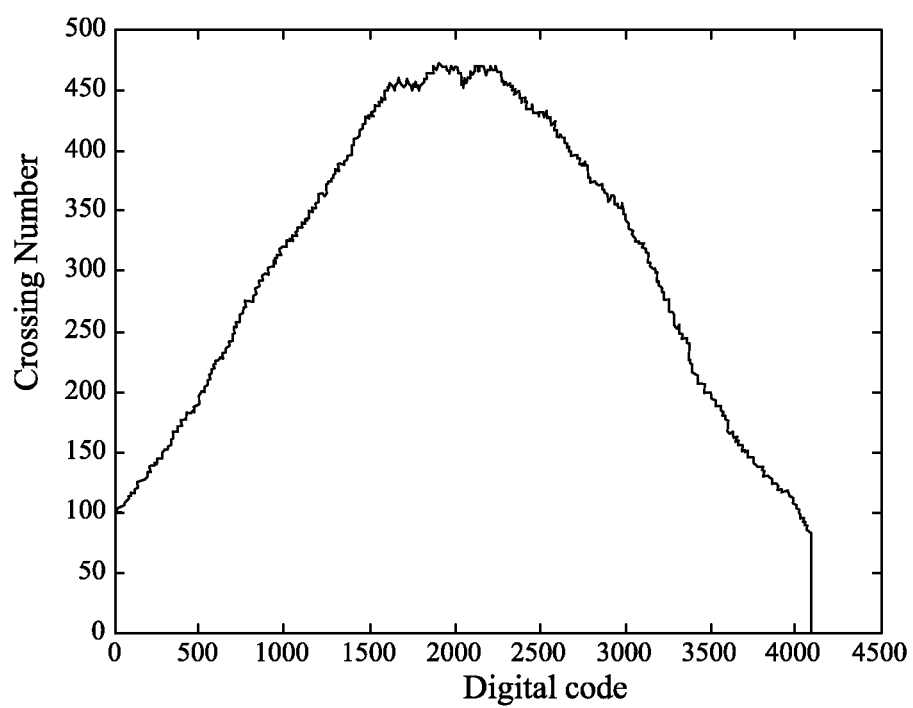
FIG. 5 is a plot illustrating an exemplary distribution of crossing counts acquired by the embodiment.

In an example as depicted in FIGS. 4 and 5 where the sampling time length is set to be 0.1 seconds, the sampling frequency is set to be 10 kHz, and the converting unit 422 is a 12-bit system (i.e., a total number of the digital codes is $2^{12}=4096$), 1000 (one thousand) digital codes, each of which represents a magnitude of a corresponding sample and which cooperatively form the voltage code, would be acquired during each sampling period of 0.1 seconds, and vary between 0 and 4095. The converting unit 422 acquires, for each sampling period, the voltage variation graph that plots the voltage variation curve of the digital codes against time (e.g., against sample number), as shown in FIG. 4. In this embodiment, the converting unit 422 samples the analog voltage signal with continuous sampling periods, so as to consecutively acquire a plurality of corresponding voltage variation graphs.

The statistic module 43 acquires, for the voltage variation curve of each voltage variation graph, a set of crossing numbers (i.e., a voltage ride through frequency histogram) that respectively correspond to the digital codes by: for each of the digital codes, making a straight line that has a constant value equaling the digital code across time in the voltage variation graph, and counting a number of crossings of the voltage variation curve with the straight line to serve as a corresponding one of the crossing numbers (i.e., a corresponding voltage ride through frequency). As exemplified in FIG. 4, the statistic module 43 makes the straight line 430 which corresponds to one of the digital codes, and then scans the straight line 430 with respect to time so as to count a number of crossings of the voltage variation curve with the straight line 430 to serve as a crossing number that corresponds to said one of the digital codes. Such operation may be performed for each of the digital codes in sequence (e.g., from 0 to 4095 in this embodiment), but this disclosure is not limited thereto. Based on the set of crossing numbers thus acquired, distribution of the crossing numbers with respect to the digital codes may be obtained, as shown in FIG. 5.

The analysis module 44 is coupled to the statistic module 43 for receiving the crossing numbers therefrom, analyzes, for each set of crossing numbers, the distribution of the crossing numbers with respect to the digital codes, and outputs, based on the distribution of the crossing numbers thus analyzed, one of the digital codes to serve as an output code. In this embodiment, the analysis module 44 determines whether or not the distribution of the crossing numbers corresponds to Gaussian distribution, thereby roughly estimating characteristics and possible distribution of noise. A variety of conventional methods may be used to determine whether or not a distribution corresponds to Gaussian distribution, and details thereof are omitted herein for the sake of brevity. In this embodiment, when the distribution of the crossing numbers is determined to correspond to Gaussian distribution, the analysis module 44 acquires a fitting curve by performing Gaussian distribution fitting (e.g., using maximum likelihood estimation) on the distribution of the crossing numbers, and acquires one of the digital codes that corresponds to a maximum crossing number in the fitting curve to serve as the output code; and when the distribution of the crossing numbers is determined to not correspond to Gaussian distribution, the analysis module 44 acquires an average of a portion of the digital codes that corresponds to a top predetermined percentage of the crossing numbers to serve as the output code. The predetermined percentage may be selected from a range of between 5% and 15%, and is selected to be 10% in this embodiment.

It is noted that the statistic module 43 and the analysis module 44 may be realized using a computerized system that executes an appropriate software program.

The code-to-current conversion circuit 5 is communicatively coupled to the analysis module 44 for receiving the output code therefrom, converts the output code into a corresponding voltage, and converts the voltage thus converted into an output current signal.

The dose conversion device 6 is coupled to the code-to-current conversion circuit 5 for receiving therefrom the output current signal, and converts a magnitude of the output current signal into a dose index of the ionizing radiation. A variety of conventional methods may be used to realize such conversion, and details thereof are omitted herein for the sake of brevity.

Figure 3:
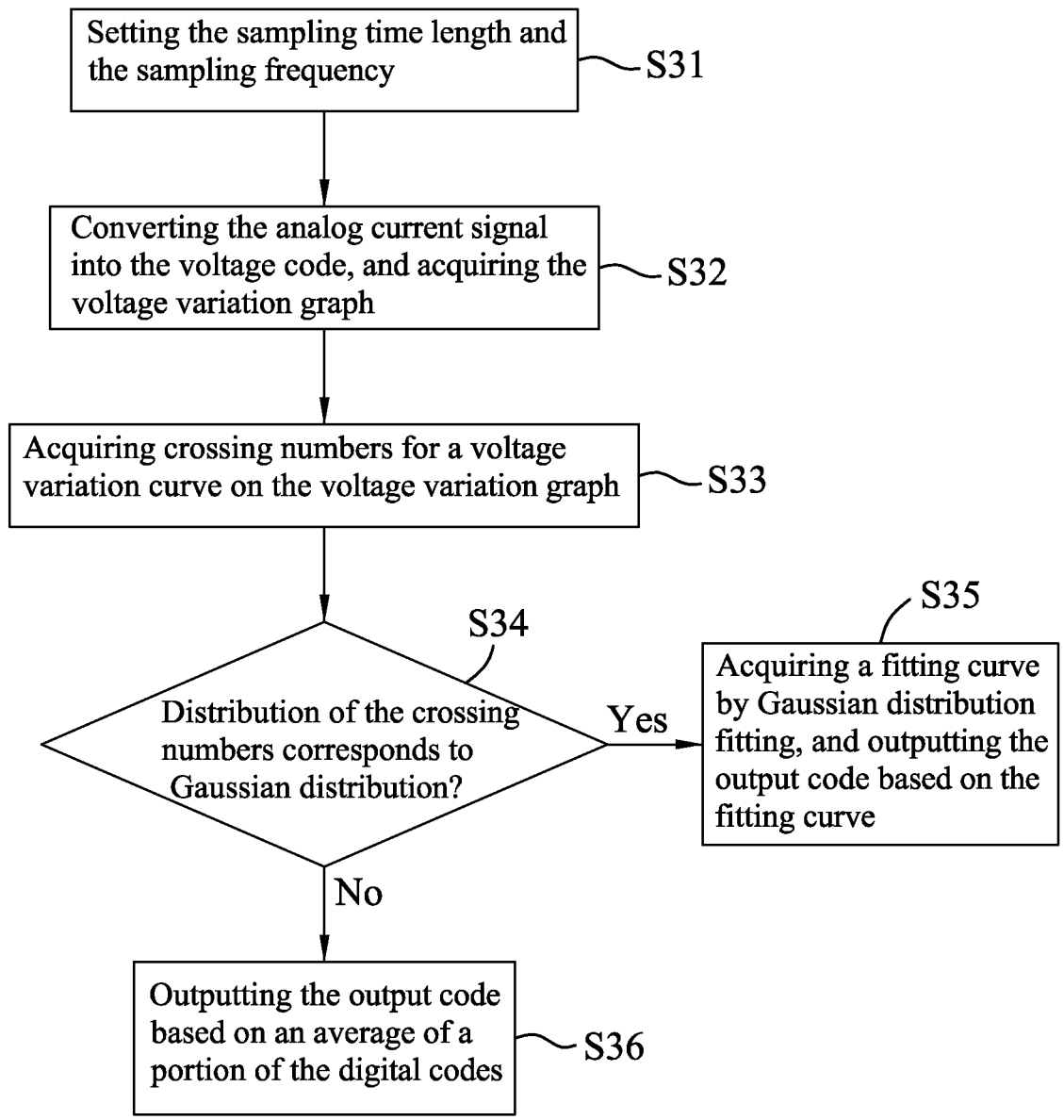
FIG. 3 is a flow chart illustrating steps of an embodiment of a method for measuring low currents according to this disclosure.

Referring to FIGS. 2 and 3, the current measuring device 4 measures low currents based on a method that includes the following steps S31 to S36.

Step S31: The sampling time length and the sampling frequency are set through the setting unit 421 of the analog-to-digital converter 42.

Step S32: The transimpedance amplifier 41 converts the analog current signal, which is obtained by the radiation detector 3 sensing ionizing radiation, into the analog voltage signal, and the analog-to-digital converter 42 converts, based on the sampling time length and the sampling frequency set in step S31, the analog voltage signal into the voltage code that uses a plurality of digital codes to represent a magnitude of the analog voltage signal which varies with time, and acquires, for each sampling period having the sampling time length, a voltage variation graph that plots a voltage variation curve representing variation of the voltage code with respect to time.

Step S33: The statistic module 43 acquires, for the voltage variation curve of each voltage variation graph, a set of crossing numbers that respectively correspond to the digital codes by: for each of the digital codes, making a straight line that has a constant value equaling the digital code across time in the voltage variation graph, and counting a number of crossings of the voltage variation curve with the straight line to serve as a corresponding one of the crossing numbers.

Step S34: The analysis module 44 analyzes distribution of the crossing numbers with respect to the digital codes, and determines whether or not the distribution of the crossing numbers corresponds to Gaussian distribution. The flow goes to step S35 when the determination is affirmative, and goes to step S36 when otherwise.

Step S35: The analysis module 44 acquires a fitting curve by performing Gaussian distribution fitting on the distribution of the crossing numbers, and acquires one of the digital codes that corresponds to a maximum crossing number in the fitting curve to serve as the output code.

Step S36: The analysis module 44 acquires an average of a portion of the digital codes that corresponds to a top predetermined percentage of the crossing numbers to serve as the output code.

Table 1 shows the voltage codes outputted by the analog-to-digital converter 42, derived currents corresponding to the voltage codes, and errors of the derived currents in an experiment where a plurality of low currents that have different predetermined magnitudes were measured. In the experiment, the high resistance component used in the transimpedance amplifier 41 has a resistance of 1 G ohms; the converting unit 422 was a 12-bit system with a resolution of 0.3663 pA/digital code; the analog-to-digital converter 42, the statistic module 43, the analysis module 44, the code-to-current converter 5 and the dose conversion device 6 were realized using MSP430F5438A experimenter board, which is developed by Texas Instrument Inc., and LabVIEW, which is developed by National Instruments Corporation; and the sampling was performed with the sampling time length of 0.1 seconds and the sampling frequency of 10 kHz, so 1000 (one thousand) samples would be acquired during each sampling period. It is noted that each of the corrected voltage codes shown in Table 1 is a result of subtracting a background code corresponding to a background current from a voltage code corresponding to the measured current signal, where background code may be obtained by performing measurement when no current is measured. In this experiment, an average background code is 1115.84. The measurement error after correction by the statistic module 43 and the analysis module 44 is smaller than 1% when the to-be-measured current is greater than 20 pA, and the measurement error after correction (i.e., curve fitting) by the statistic module 43 and the analysis module 44 is smaller than 3% (not shown) when the to-be-measured current ranges between 8 pA and 20 pA, and such results may satisfy some applications that strictly requires low measurement uncertainty. In comparison to the absolute error shown in Table 1, the measurement error is significantly reduced after correction by the statistic module 43 and the analysis module 44.

TABLE 1

| To-be-measured current (pA) | Corrected voltage code (avg. of 20 tests) | Current derived from voltage code (pA) | Standard Deviation of 20 tests | Absolute error (%) |
|---|---|---|---|---|
| 100 | 264.0555 | 96.72352965 | 0.12026287 | 3.27647035 |
| 90 | 236.871 | 86.7658473 | 0.134221929 | 3.593503 |
| 80 | 209.535 | 76.7526705 | 0.197827676 | 4.059161875 |
| 70 | 181.1565 | 66.35762595 | 0.142699537 | 5.2033915 |
| 60 | 154.4855 | 56.58803865 | 0.166710433 | 5.68660225 |
| 50 | 126.5905 | 46.37010015 | 0.124540207 | 7.2597997 |
| 40 | 99.6195 | 36.49062285 | 0.150489552 | 8.773442875 |
| 30 | 71.346 | 26.1340398 | 0.129836942 | 12.886534 |
| 20 | 43.4835 | 15.92800605 | 0.223380723 | 20.3996975 |
| 18 | 38.012 | 13.9237956 | 0.212138857 | 22.64558 |
| 16 | 32.6051 | 11.94324813 | 0.301620186 | 25.35469919 |
| 14 | 27.3408 | 10.01493504 | 0.166739286 | 28.46474971 |
| 12 | 22.31485 | 8.173929555 | 0.102089538 | 31.88392037 |
| 10 | 15.90715 | 5.826789045 | 0.246321415 | 41.73210955 |
| 9 | 12.96385 | 4.748658255 | 0.109912058 | 47.2371305 |
| 8 | 10.4184 | 3.81625992 | 0.178986408 | 52.296751 |
| 7 | 7.911 | 2.8977993 | 0.076590091 | 58.60286714 |

It should be noted that the current measuring device 4 is applied to the DAP meter 2 in this embodiment for measuring low currents outputted by the radiation detector 3, but application of the current measuring device 4 is not limited thereto.

In summary, by virtue of the current measuring device 4 of this disclosure directly analyzing the crossing numbers, even if oscillation of the analog voltage signal exceeds the upper and/or lower limits of digital codes, distribution of the noises may still be precisely determined without performing any filtering on the analog voltage signal, thereby estimating the current resulting from ionizing radiation with higher precision, and thus acquiring the corresponding dose of ionizing radiation. Furthermore, time required for signal processing may also be reduced.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects.

While the disclosure has been described in connection with what is (are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A device for measuring low currents, comprising:
    a transimpedance amplifier disposed to receive an analog current signal, and configured to convert the analog current signal into an analog voltage signal;
    an analog-to-digital converter coupled to said transimpedance amplifier for receiving the analog voltage signal therefrom, and configured to convert the analog voltage signal into a voltage code that uses a plurality of digital codes to represent a magnitude of the analog voltage signal which varies with time, and to acquire a voltage variation graph that plots a voltage variation curve representing variation of the voltage code with respect to time;
    a statistic module configured to acquire a set of crossing numbers that respectively correspond to the digital codes by: for each of the digital codes, making a straight line that has a constant value equaling the digital code across time in the voltage variation graph, and counting a number of crossings of the voltage variation curve with the straight line to serve as a corresponding one of the crossing numbers; and
    an analysis module coupled to said statistic module for receiving the crossing numbers therefrom, and configured to analyze distribution of the crossing numbers with respect to the digital codes, and to output, based on the distribution of the crossing numbers thus analyzed, one of the digital codes to serve as an output code;
    wherein said analysis module is configured to:
        determine whether or not the distribution of the crossing numbers corresponds to Gaussian distribution, and
        when the distribution of the crossing numbers is determined to correspond to Gaussian distribution, acquire a fitting curve by performing Gaussian distribution fitting on the distribution of the crossing numbers, and acquire one of the digital codes that corresponds to a maximum crossing number in the fitting curve to serve as the output code; and
    wherein said analysis module is further configured to, when the distribution of the crossing numbers is determined to not correspond to Gaussian distribution, acquire an average of a portion of the digital codes that corresponds to a top predetermined percentage of the crossing numbers to serve as the output code.

2. The device of Claim 1, wherein the top predetermined percentage is selected from a range of between 5% and 15%.

3. The device of Claim 1, wherein the top predetermined percentage is 10%.

4. The device of claim 1, wherein said analog-to-digital converter includes:
    a setting unit operable to set a sampling time length and a sampling frequency; and
    a converting unit configured to sample the analog voltage signal with the sampling frequency during a plurality of sampling periods each having the sampling time length so as to generate the voltage code for each of the sampling periods, and to acquire the voltage variation graph for each of the sampling periods;
    wherein said statistic module is configured to acquire the set of the crossing numbers for each of the sampling periods; and
    wherein said analysis module is configured to analyze, for each of the sampling periods, distribution of a corresponding set of the crossing numbers, and to output, for each of the sampling periods, the output code based on the distribution of the corresponding set of the crossing numbers thus analyzed.

5. The device of claim 4, wherein the sampling frequency is selected from a range of between 1 kHz and 10 kHz.

6. The device of claim 1, wherein said analysis module is configured to acquire an average of a portion of the digital codes that corresponds to a top predetermined percentage of the crossing numbers to serve as the output code.

7. A method for measuring low currents, comprising steps of:
    (A) converting, by a transimpedance amplifier, an analog current signal into an analog voltage signal;
    (B) by an analog-to-digital converter, converting the analog voltage signal into a voltage code that uses a plurality of digital codes to represent a magnitude of the analog voltage signal which varies with time, and acquiring a voltage variation graph that plots a voltage variation curve representing variation of the voltage code with respect to time;
    (C) acquiring, by a statistic module, a set of crossing numbers that respectively correspond to the digital codes by: for each of the digital codes, making a straight line that has a constant value equaling the digital code across time in the voltage variation graph, and counting a number of crossings of the voltage variation curve with the straight line to serve as a corresponding one of the crossing numbers; and
    (D) by an analysis module, analyzing distribution of the crossing numbers with respect to the digital codes, and outputting, based on the distribution of the crossing numbers thus analyzed, one of the digital codes to serve as an output code;
    wherein said step (D) includes:
        determining whether or not the distribution of the crossing numbers corresponds to Gaussian distribution;
        when the distribution of the crossing numbers is determined to correspond to Gaussian distribution, acquiring a fitting curve by performing Gaussian distribution fitting on the distribution of the crossing numbers, and acquiring one of the digital codes that corresponds to a maximum crossing number in the fitting curve to serve as the output code; and
    wherein said step (D) further includes: when the distribution of the crossing numbers is determined to not correspond to Gaussian distribution, acquiring an average of a portion of the digital codes that corresponds to a top predetermined percentage of the crossing numbers to serve as the output code.

8. The method of Claim 7, wherein the top predetermined percentage is selected from a range of between 5% and 15%.

9. The method of Claim 7, wherein the top predetermined percentage is 10%.

10. The method of claim 7, wherein
    said step (B) includes: sampling the analog voltage signal with a specific sampling frequency during a plurality of sampling periods each having a specific sampling time length so as to generate the voltage code for each of the sampling periods, and acquiring the voltage variation graph for each of the sampling periods;

said step (C) includes: acquiring a set of the crossing numbers for each of the sampling periods; and said step (D) includes: analyzing, for each of the sampling periods, distribution of a corresponding set of the crossing numbers, and outputting, for each of the sampling periods, the output code based on the distribution of the corresponding set of the crossing numbers thus analyzed.

11. The method of claim 7, wherein said step (D) includes: acquiring an average of a portion of the digital codes that corresponds to a top predetermined percentage of the crossing numbers to serve as the output code.

12. A device for measuring low currents, comprising:
a transimpedance amplifier disposed to receive an analog current signal, and configured to convert the analog current signal into an analog voltage signal;
an analog-to-digital converter coupled to said transimpedance amplifier for receiving the analog voltage signal therefrom, and configured to convert the analog voltage signal into a voltage code that uses a plurality of digital codes to represent a magnitude of the analog voltage signal which varies with time, and to acquire a voltage variation graph that plots a voltage variation curve representing variation of the voltage code with respect to time;
a statistic module configured to acquire a set of crossing numbers that respectively correspond to the digital codes by: for each of the digital codes, making a straight line that has a constant value equaling the digital code across time in the voltage variation graph, and counting a number of crossings of the voltage variation curve with the straight line to serve as a corresponding one of the crossing numbers; and
an analysis module coupled to said statistic module for receiving the crossing numbers therefrom, and configured to analyze distribution of the crossing numbers with respect to the digital codes, and to output, based on the distribution of the crossing numbers thus analyzed, one of the digital codes to serve as an output code;
wherein said analog-to-digital converter includes:
a setting unit operable to set a sampling time length and a sampling frequency; and
a converting unit configured to sample the analog voltage signal with the sampling frequency during a plurality of sampling periods each having the sampling time length so as to generate the voltage code for each of the sampling periods, and to acquire the voltage variation graph for each of the sampling periods;
wherein said statistic module is configured to acquire the set of the crossing numbers for each of the sampling periods; and
wherein said analysis module is configured to analyze, for each of the sampling periods, distribution of a corresponding set of the crossing numbers, and to output, for each of the sampling periods, the output code based on the distribution of the corresponding set of the crossing numbers thus analyzed.

* * * * *